(12) United States Patent
Ju

(10) Patent No.: US 9,954,312 B1
(45) Date of Patent: Apr. 24, 2018

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/649,779

(22) Filed: Jul. 14, 2017

(30) Foreign Application Priority Data

Apr. 11, 2017 (CN) .................... 2017 2 0370979 U

(51) Int. Cl.
| | | |
|---|---|---|
| H01R 12/00 | (2006.01) | |
| H01R 13/627 | (2006.01) | |
| H01R 13/24 | (2006.01) | |
| H01R 12/70 | (2011.01) | |
| H01R 13/40 | (2006.01) | |

(52) U.S. Cl.
CPC ....... *H01R 13/6276* (2013.01); *H01R 12/707* (2013.01); *H01R 13/2485* (2013.01); *H01R 13/40* (2013.01)

(58) Field of Classification Search
CPC ... H01R 12/707; H01R 13/2485; H01R 13/40
USPC ...................................... 439/83, 81
See application file for complete search history.

(56) References Cited

U.S. PATENT DOCUMENTS

| | | | | |
|---|---|---|---|---|
| 5,702,255 A | * | 12/1997 | Murphy | H01R 13/2478 439/71 |
| 6,155,845 A | * | 12/2000 | Lin | H01R 4/028 439/78 |
| 6,533,590 B1 | * | 3/2003 | Lee | H01R 4/027 439/83 |
| 6,702,594 B2 | * | 3/2004 | Lee | H01R 4/028 439/70 |
| 6,875,025 B2 | * | 4/2005 | Hsu | H01R 13/112 439/140 |
| 6,955,545 B1 | * | 10/2005 | Morana | H01R 13/112 439/83 |

(Continued)

FOREIGN PATENT DOCUMENTS

| | | |
|---|---|---|
| CN | 2718822 Y | 8/2005 |
| CN | 203056199 U | 7/2013 |
| CN | 203631808 U | 6/2014 |

*Primary Examiner* — Abdullah Riyami
*Assistant Examiner* — Vladimir Imas
(74) *Attorney, Agent, or Firm* — Locke Lord LLP; Tim Tingkang Xia, Esq.

(57) ABSTRACT

An electrical connector for electrically connecting a chip module to a circuit board includes an insulating body with receiving holes running through the insulating body, terminals correspondingly received in the receiving holes, and metal members not in contact with the chip module. Each metal member and the terminal corresponding to the metal member are received in the same receiving hole. Each metal member has a connecting portion disposed at a side of a soldering portion of a terminal, and a clamping portion extending and bending from the connecting portion to bypass the soldering portion and extend along a direction from the side to another opposite side of the soldering portion, so that the clamping and soldering portions jointly clamp a solder ball with a reduced distance between the terminals on a strip and without the terminals being inserted into the same row of receiving holes at intervals for multiple times.

12 Claims, 15 Drawing Sheets

(56) References Cited

U.S. PATENT DOCUMENTS

| | | | | |
|---|---|---|---|---|
| 7,001,190 B2* | 2/2006 | Morana | H01R 13/112 | 439/81 |
| 7,553,202 B2* | 6/2009 | Ma | H01R 12/57 | 439/839 |
| 7,682,165 B2* | 3/2010 | Liao | H05K 3/3426 | 439/342 |
| 7,938,649 B2* | 5/2011 | Gattuso | H01R 12/57 | 439/71 |
| 8,052,436 B1* | 11/2011 | Ju | H01R 12/57 | 439/342 |
| 8,147,256 B2* | 4/2012 | Jin | H01R 12/52 | 439/83 |
| 8,192,206 B1* | 6/2012 | Ju | H01R 12/57 | 439/66 |
| 8,414,311 B2* | 4/2013 | Ju | H01R 12/89 | 439/83 |
| 8,708,716 B1* | 4/2014 | Ho | H01R 12/714 | 439/83 |
| 8,974,237 B2* | 3/2015 | Wehrle | H01R 12/57 | 439/83 |
| 2006/0258191 A1* | 11/2006 | Chen | H05K 3/3426 | 439/83 |
| 2009/0088016 A1* | 4/2009 | Liao | H05K 3/3426 | 439/357 |
| 2010/0081329 A1* | 4/2010 | Fan | H01R 12/57 | 439/626 |

* cited by examiner

ELECTRICAL CONNECTOR

CROSS-REFERENCE TO RELATED APPLICATION

This non-provisional application claims priority to and benefit of, under 35 U.S.C. § 119(a), Patent Application No. 201720370979.0 filed in P.R. China on Apr. 11, 2017, the entire content of which is hereby incorporated by reference.

FIELD OF THE INVENTION

The present invention relates to an electrical connector, and more particularly to an electrical connector for electrically connecting a chip module to a circuit board.

BACKGROUND OF THE INVENTION

Chinese Patent No. CN201220644972.0 discloses an electrical connector, which comprises a body provided with receiving holes, and terminals received in the receiving holes to conduct a chip module and a circuit board, wherein the terminal comprises a base portion, an extending arm, a soldering portion and an elastic arm, and the soldering portion comprises two clamping portions which horizontally extend and are used for clamping a solder ball.

However, the electrical connector at least has the following disadvantages that: the spreading width of the two clamping portions on a strip of the terminal is relatively large, and the distance between the receiving holes becomes smaller because of the development tendency of higher density of the terminals of the electrical connector, so that the larger spreading width of the terminal on the strip enables the distance between the terminals on the strip to be larger than the distance between the receiving holes, resulting in the situation that the terminals arranged on the strip need to be assembled for multiple times when entering into the same row of receiving holes of the insulating body, for example, the terminals are firstly inserted into odd receiving holes such as first, third and fifth of the same row, and then the terminals are inserted into even receiving holes such as second, fourth and sixth of the same row, so multiple assembly procedures are needed. Therefore, it is necessary to design a novel electrical connector to overcome the above-mentioned problems.

SUMMARY OF THE INVENTION

In view of the above problems in the related art, the present invention is directed to an electrical connector in which the distance between terminals on a strip is small, so the assembly procedure that the terminals are inserted into the same row of receiving holes of an insulating body can be completed once.

To achieve the foregoing objective, the present invention uses the following technical solutions.

In one aspect, the present invention relates to an electrical connector for electrically connecting a chip module, including an insulating body provided with multiple receiving holes running through the insulating body vertically, multiple terminals respectively and correspondingly received in the receiving holes, and multiple metal members not in contact with the chip module and fixed on the terminals. Each of the terminals has a soldering portion, each of the metal members and the terminal are received in the same receiving hole, and each of the metal members has a connecting portion positioned at one side of the soldering portion; and a clamping portion is formed by bending and extending from the connecting portion, the clamping portion bypasses the soldering portion and extends to the other opposite side of the soldering portion, so that the clamping portion and the soldering portion jointly clamp a solder ball.

In certain embodiments, two clamping portions are arranged, and are respectively formed by bending and extending from the two opposite sides of the connecting portion along a horizontal direction.

In certain embodiments, the receiving hole is provided with two side walls which are oppositely arranged, each of the side walls is concavely provided with a retaining slot for retaining the terminal, and the two clamping portions extend out of the lower surface of the insulating body and are stopped below the bottom surface of the side walls.

In certain embodiments, the terminal has a base portion in a vertical flat plate shape, a first arm formed by bending and extending upwardly from the base portion to a direction away from a vertical plane where the base portion is positioned, and a second arm formed by inversely bending and extending from the first arm to pass beyond the vertical plane where the base portion is positioned, a contact portion is formed by extending from the tail end of the second arm and is used for abutting up the chip module, and the first arm and the clamping portions are positioned at the same side of the vertical plane where the base portion is positioned.

In certain embodiments, a strip connecting portion which is in a flat plate shape and is formed by upwardly and vertically extending from the base portion is used for connecting a strip, and a gap is reserved between the strip connecting portion and the first arm; a stopping portion is formed from the connecting portion, and the stopping portion downwardly and obliquely extends to the base portion; and the gap is provided with a bottom surface positioned below the stopping portion to limit the metal member from moving down.

In certain embodiments, a limiting portion is formed from the side of the strip connecting portion away from the first arm, and the limiting portion upwardly and obliquely extends to the connecting portion; and a notch is formed at one side of the connecting portion, and the notch is provided with a top surface positioned above the limiting portion to limit the metal member from moving down.

In certain embodiments, the connecting portion is in a vertical flat plate shape, and the connecting portion and the vertical plane where the base portion is positioned are soldered by laser.

In certain embodiments, both the connecting portion and the soldering portion are in a vertical flat plate shape, the connecting portion and the soldering portion are soldered by laser, and the connecting portion and the soldering portion extend out of the lower surface of the insulating body.

In certain embodiments, the clamping portion is formed by bending and extending from one side of the connecting portion along the horizontal direction, a holding arm is formed by bending and extending from one side of the soldering portion along the horizontal direction, and the soldering portion, the holding arm and the clamping portion jointly clamp the solder ball.

In certain embodiments, the soldering portion and the clamping portion extend out of the lower surface of the insulating body, and the clamping portion is stopped at the lower surface of the insulating body.

In certain embodiments, the electrical connector further includes: a bending portion and a base portion. The bending portion extends from the soldering portion, and includes: a first upward bending portion, extending and bending upwardly from an upper end of the soldering portion; a horizontal extending portion, extending horizontally from the first upward bending portion; and a second upward bending portion, extending and bending upwardly from the horizontal extending portion; and a base portion is formed by upwardly and vertically extending from the bending portion. The base portion extends upwardly and vertically from the bending portion, and is provided with a first side surface and a second side surface which are opposite to each other. One of the receiving holes is provided with a second side wall facing the first side surface; and the clamping portion extends from the second side surface toward the first side surface and is stopped below the bottom surface of the second side wall.

In certain embodiments, the soldering portion is positioned at one side of the solder ball and is in an arc shape along the horizontal direction.

Compared with the related art, the present invention has the following beneficial effects:

The solder ball is fixed and then jointly clamped by the metal member and the terminal, so that the distance between the terminals on a strip is greatly reduced, and the assembly procedure that the terminals are inserted into the same row of receiving holes of the insulating body can be completed once without inserting the terminals into the same row of receiving holes at intervals for multiple times.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
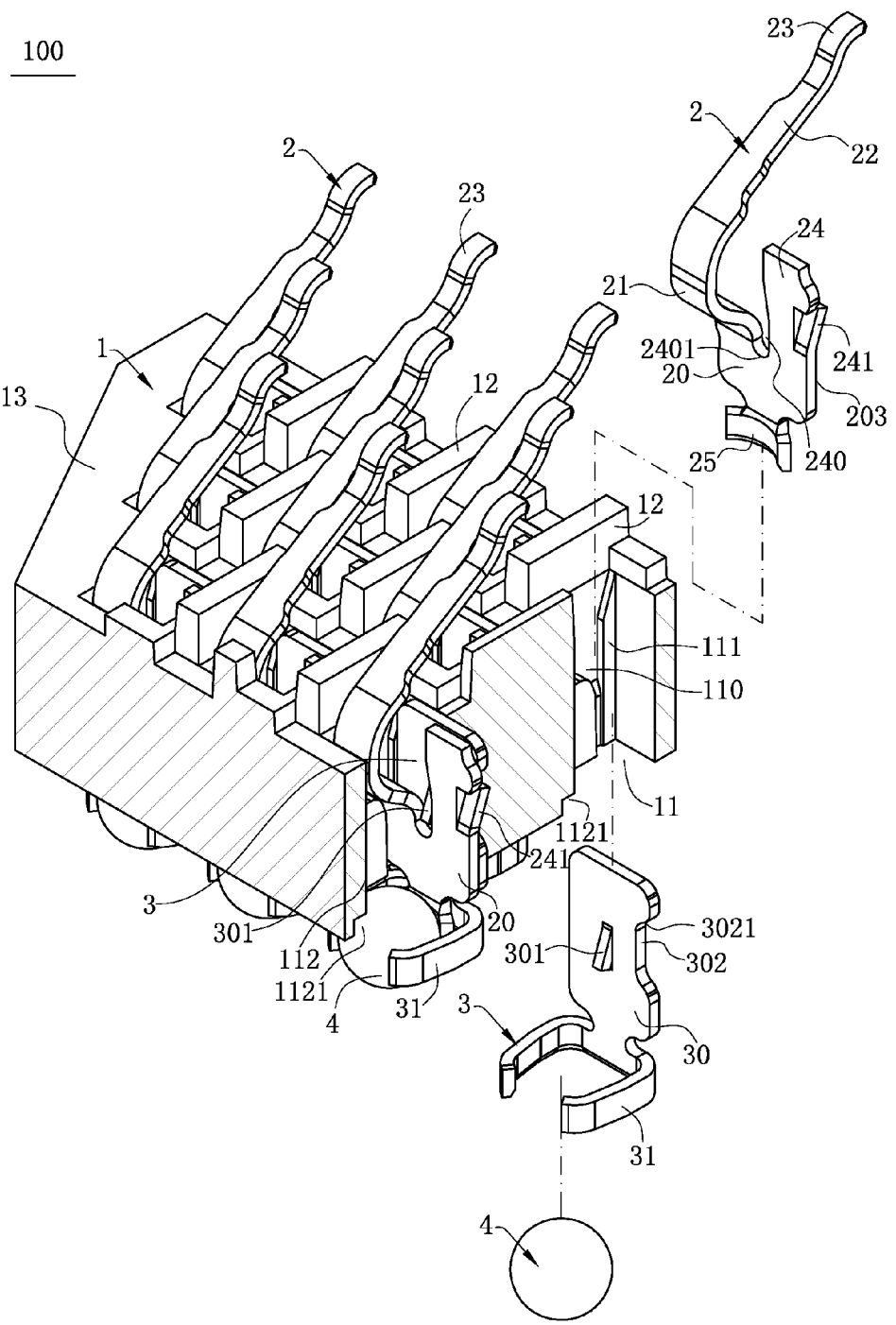
FIG. 1 is a three-dimensional sectional view of embodiment 1 of an electrical connector according to the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-15. In accordance with the purposes of this invention, as embodied and broadly described herein, this invention, in one aspect, relates to an electrical connector.

As shown in FIG. 1 to FIG. 8, an electrical connector 100 for electrically connecting a chip module 200 to a circuit board 300 in embodiment 1 according to the present invention comprises an insulating body 1, provided with multiple receiving holes 11 running through the insulating body 1 vertically; multiple terminals 2, respectively and correspondingly received in the receiving holes 11; and multiple metal members 3, where each of the metal members 3 and the terminal 2 are fixed and received in the same receiving hole 11, and each of the metal members 3 and the terminal 2 jointly clamp and fix a solder ball 4.

As shown in FIG. 1 to FIG. 8, the insulating body 1 is provided with an upper surface 13 and a lower surface 14 which are oppositely arranged, and the upper surface 13 is upwardly and convexly provided with multiple protruding blocks 12 for supporting the chip module 200. Each of the receiving holes 11 is provided with two opposite first side walls 111, and the two first side walls 111 are oppositely and concavely provided with two retaining slots 110; the receiving hole 11 is also provided with a second side wall 112 connected with the two first side walls 111, and the bottom surface of the second side wall 112 is upwardly and concavely provided with a groove 1121 communicated with the receiving hole 11; and the top surface of the groove 1121 is positioned above the solder ball 4 to limit the solder ball 4 to moving up.

As shown in FIG. 1, each of the terminals 2 has a base portion 20 which is in a flat plate shape and is retained in the retaining slot 110, the base portion 20 has a vertical plane 203, a first arm 21 which is formed by bending and extending upwardly from the base portion 20 to a direction away from the vertical plane 203, and a second arm 22 which is formed by inversely bending and extending from the first arm 21 to pass beyond the vertical plane 203, and an arc-shaped contact portion 23 is formed by extending from the tail end of the second arm 22 and abuts up the chip module 200. A strip connecting portion 24 which is in a flat plate shape and is formed by upwardly extending from the base portion 20 is used for connecting a strip (not shown), a gap 240 is reserved between the strip connecting portion 24 and the first arm 21, and the gap 240 is provided with a bottom surface 2401; and a limiting portion 241 is formed from the side of the strip connecting portion 24 away from the first arm 21. A soldering portion 25 is formed by downwardly extending from the base portion 20, the soldering portion 25 is positioned at one side of the solder ball 4 and is in an arc shape along the horizontal direction, and the soldering portion 25 extends out of the lower surface 14.

Figure 2:
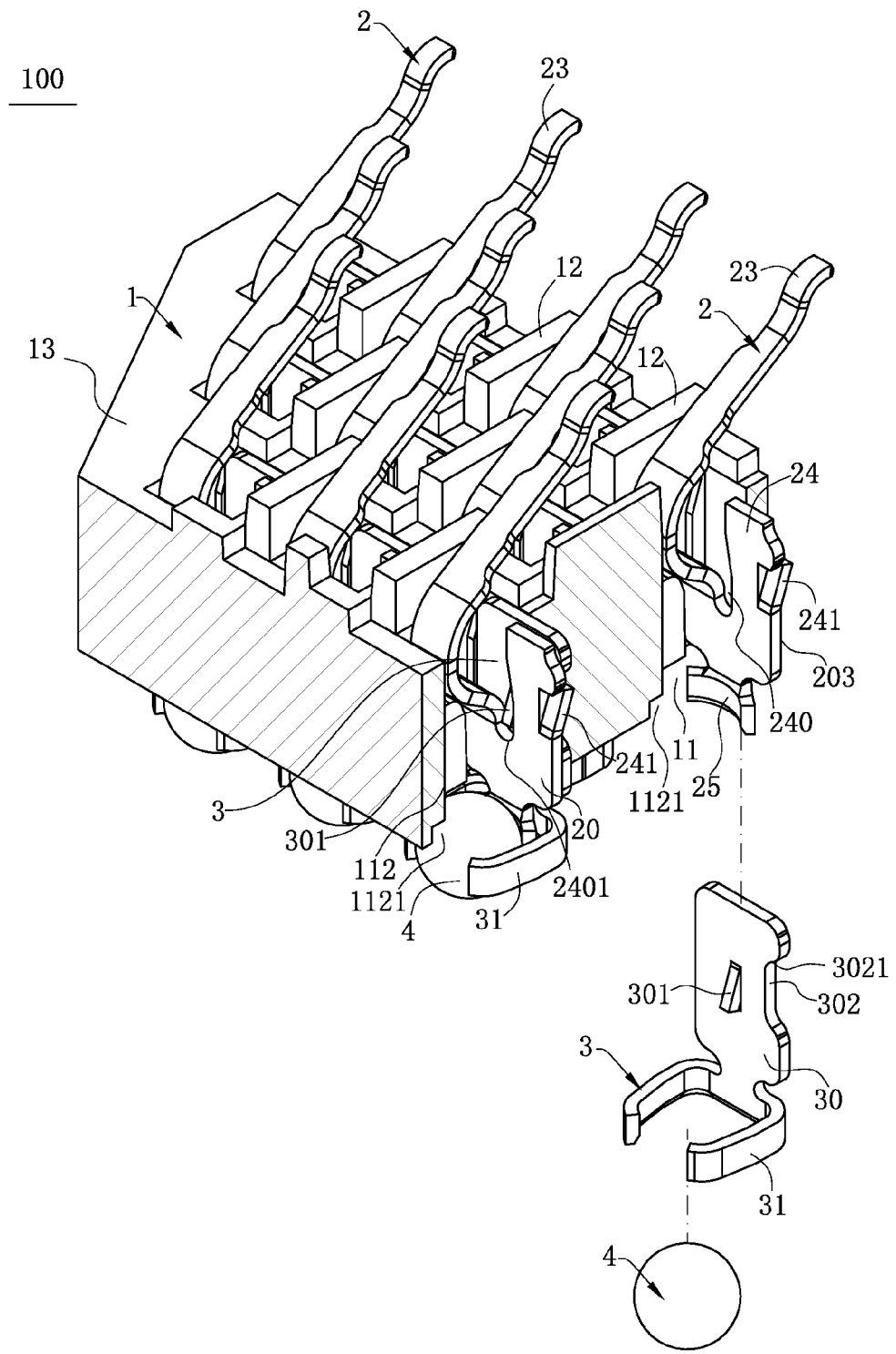
FIG. 2 is another three-dimensional sectional view of embodiment 1 of the electrical connector according to the present invention.
Figure 3:
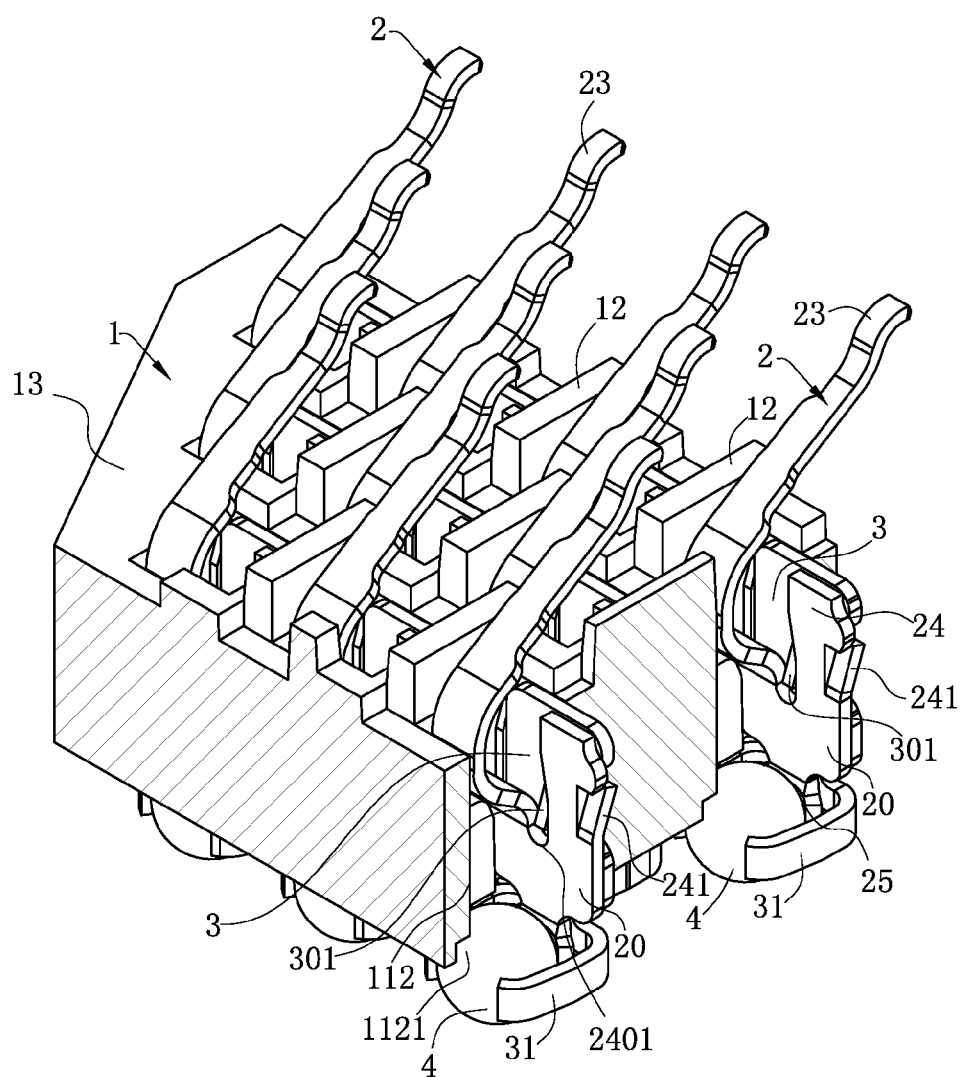
FIG. 3 is a three-dimensional sectional view of embodiment 1 of the electrical connector according to the present invention after assembly.
Figure 4:
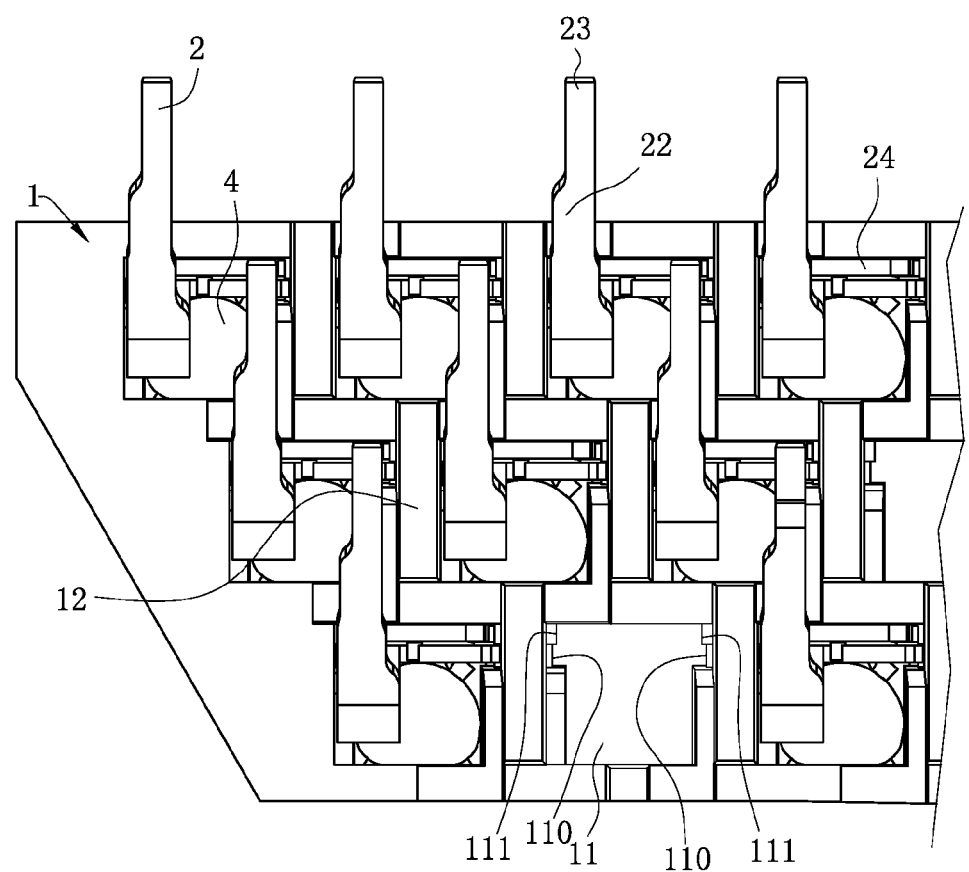
FIG. 4 is a planar sectional view of FIG. 3.
Figure 5:
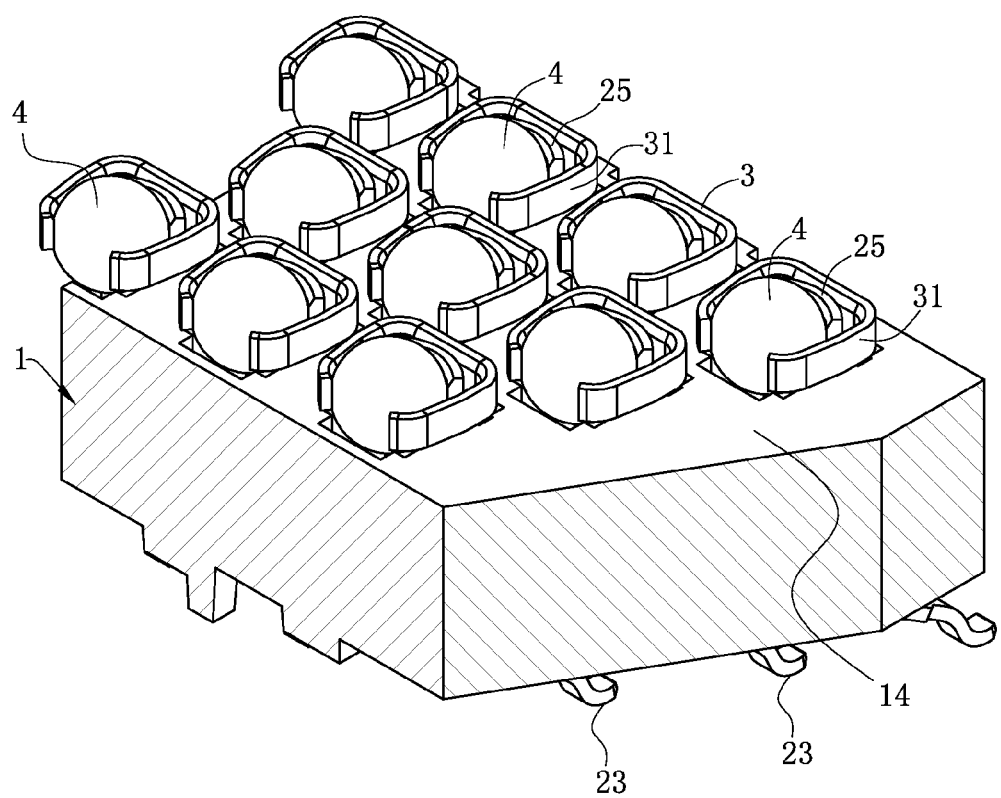
FIG. 5 is another plan view of FIG. 3.
Figure 6:
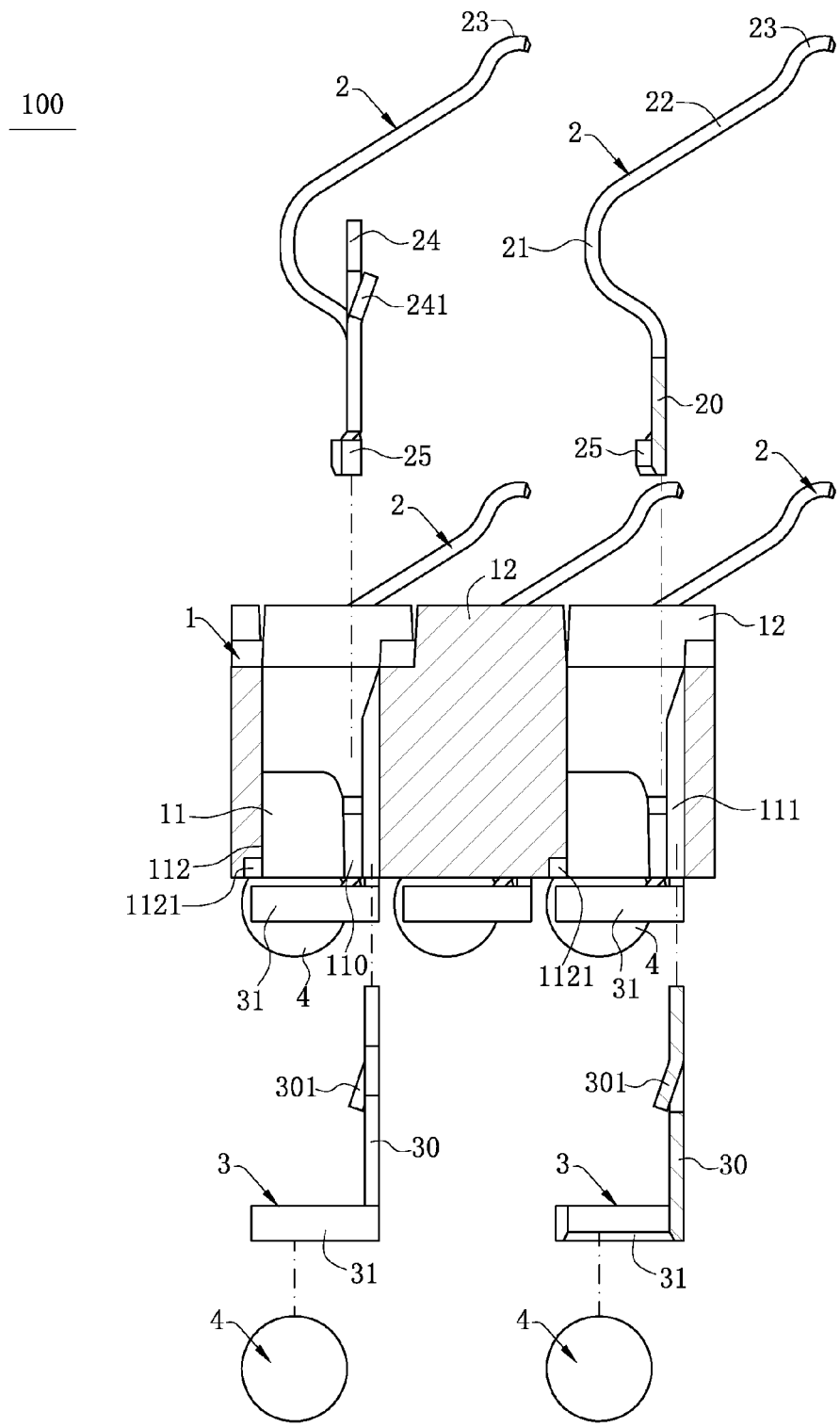
FIG. 6 is a planar sectional view of embodiment 1 of the electrical connector according to the present invention.
Figure 7:
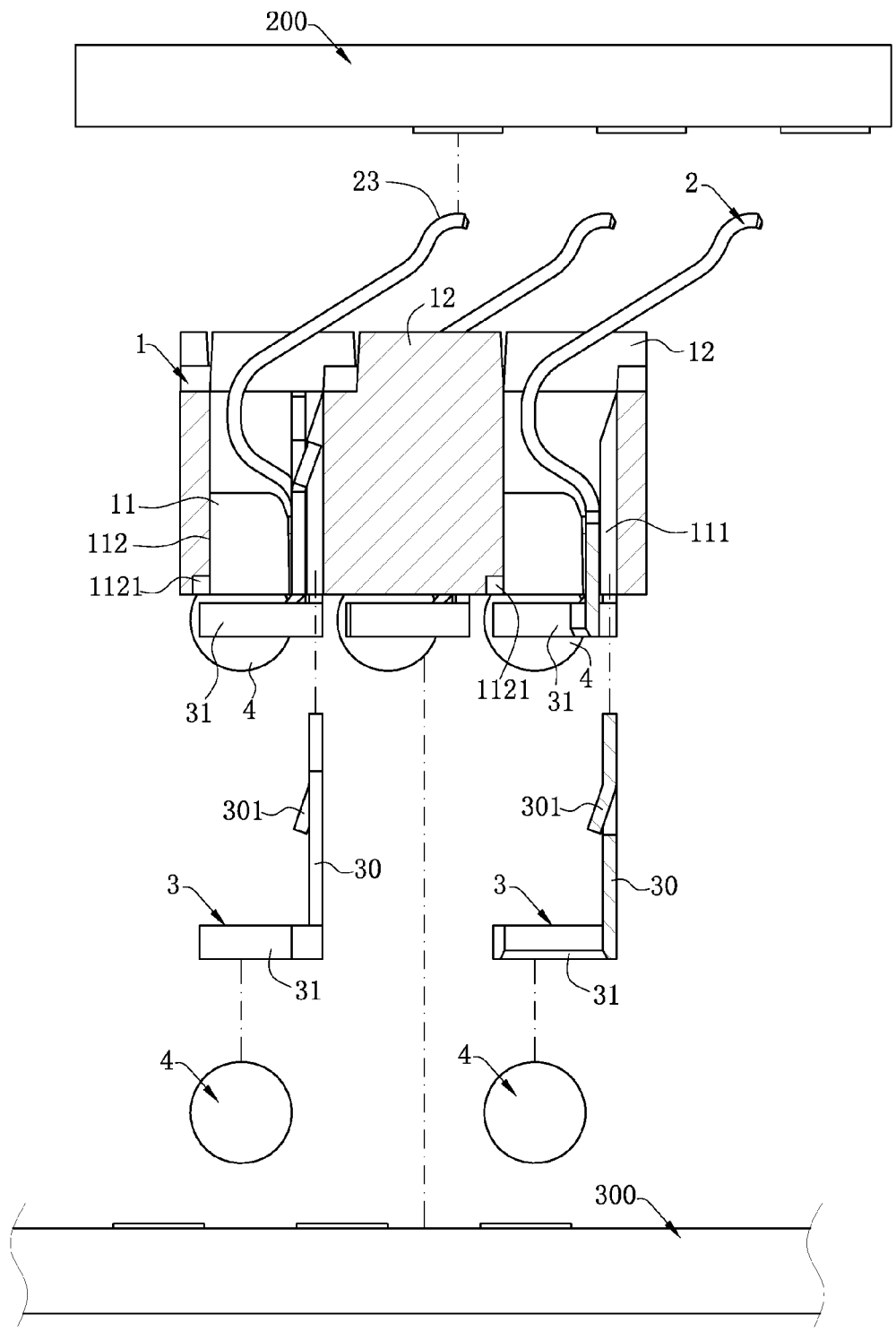
FIG. 7 is a local sectional view of embodiment 1 of the electrical connector according to the present invention, positioned between a chip module and a circuit board when the chip module is not pressed down.
Figure 8:
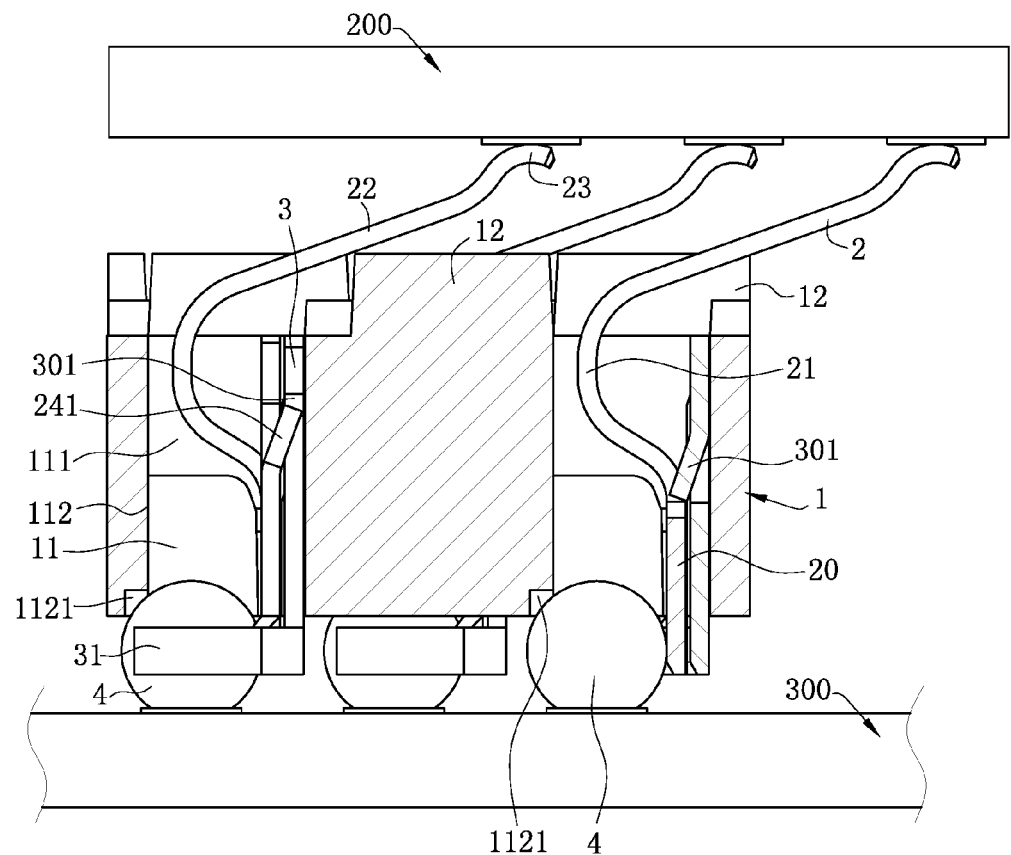
FIG. 8 is a local sectional view of embodiment 1 of the electrical connector according to the present invention, positioned between the chip module and the circuit board when the chip module is pressed down.

As shown in FIG. 1 and FIG. 2, the metal member 3 is not in contact with the chip module 200, and comprises a connecting portion 30 which is in a vertical flat plate shape, where the connecting portion 30 is positioned at one side of the soldering portion 25, and the connecting portion 30 forms a stopping portion 301; and the stopping portion 301 downwardly and obliquely extends to the base portion 20, and the bottom surface 2401 is positioned below the stopping portion 301 to limit the metal member 3 from moving down. The limiting portion 241 upwardly and obliquely extends to the connecting portion 30, and a notch 302 is formed at one side of the connecting portion 30; and the notch 302 is provided with a top surface 3021 positioned above the limiting portion 241 to limit the metal member 3 from moving down. After the terminal 2 is inserted into the receiving hole 11 in a direction from the upper surface 13 to the lower surface 14 of the insulating body 1, the metal member 3 is then inserted in a direction from the lower surface 14 to the upper surface 13 of the insulating body 1, and both the stopping portion 301 and the limiting portion 241 limit the metal member 3 from moving down, thereby ensuring the stable fixing of the metal member 3 and the terminal 2. Two clamping portions 31 are formed by bypassing the soldering portion 25 and horizontally bending and extending to the other opposite side of the soldering portion 25 from the two opposite sides of the connecting portion 30, and the two clamping portions 31 and the soldering portion 25 of the terminal 2 jointly clamp the solder ball 4. The two clamping portions 31 extend out of the lower surface 14 and are stopped below the bottom surface of the first side wall 111 to limit the metal member 3 from moving up.

Figure 9:
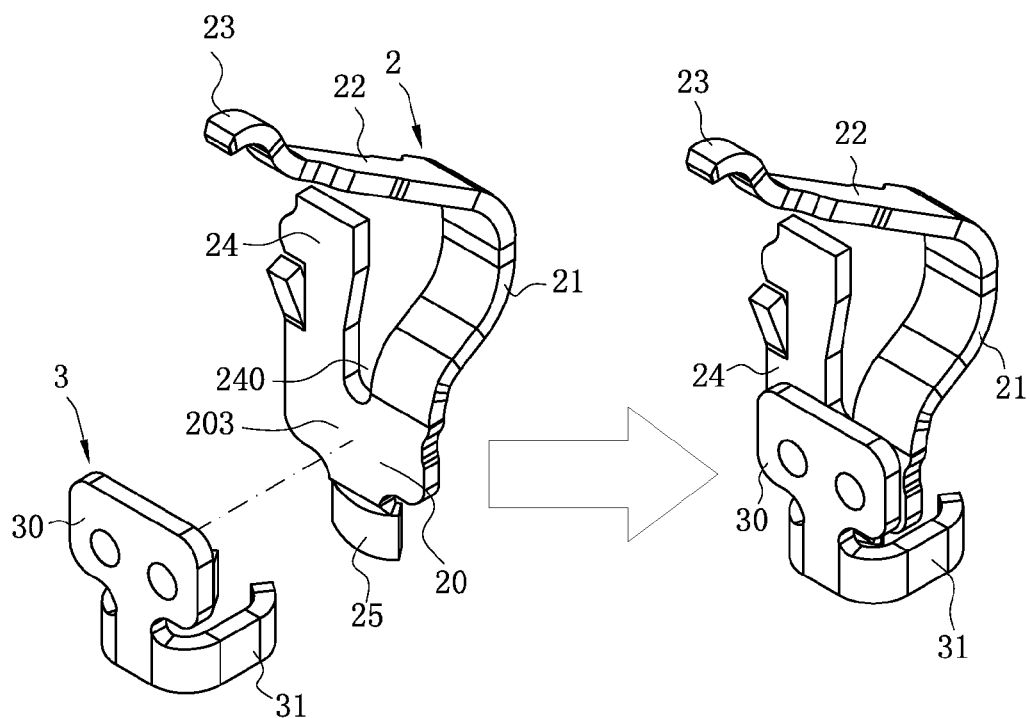
FIG. 9 is a schematic diagram of laser soldering of terminals and metal members of embodiment 2 of the electrical connector according to the present invention.
Figure 10:
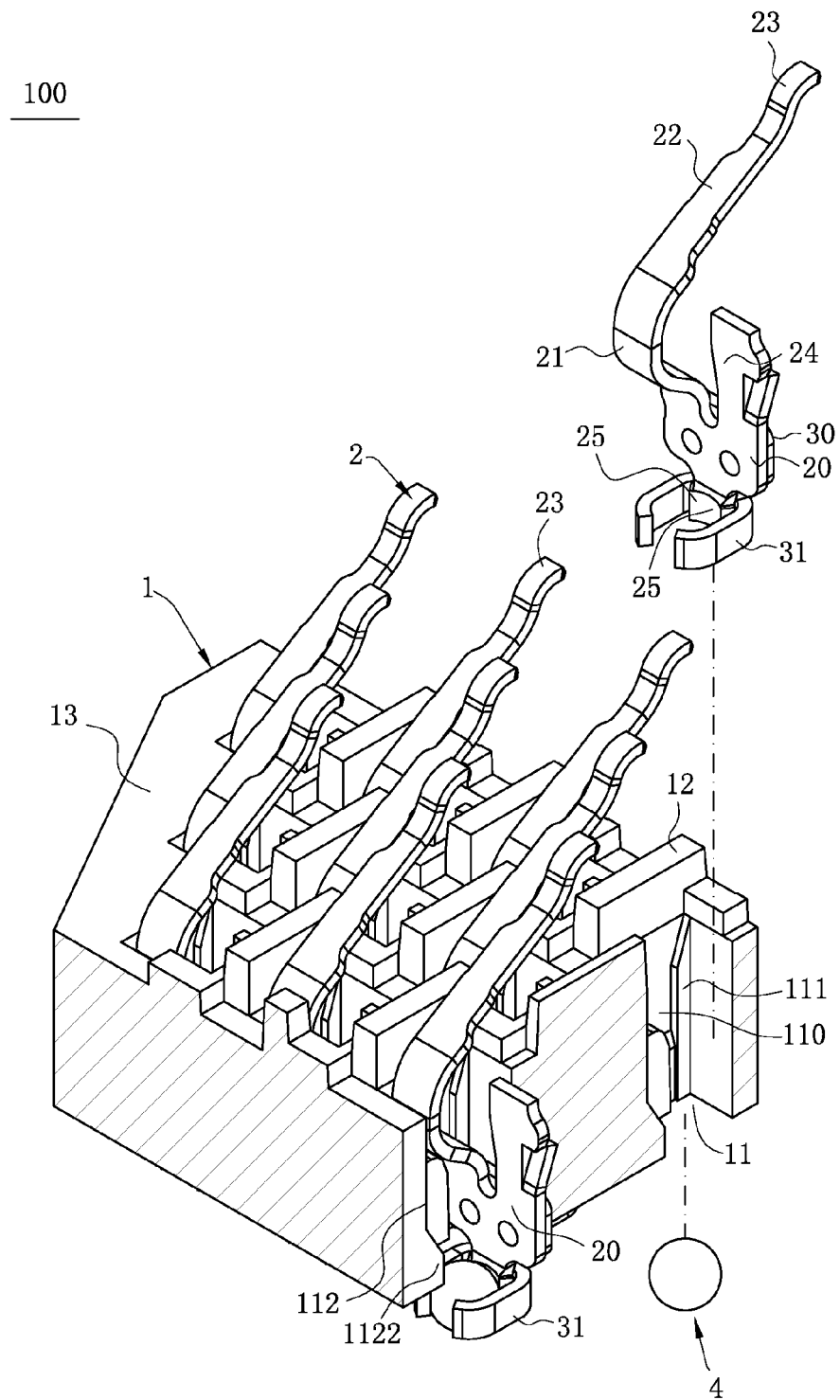
FIG. 10 is a three-dimensional sectional view of embodiment 2 of the electrical connector according to the present invention.
Figure 11:
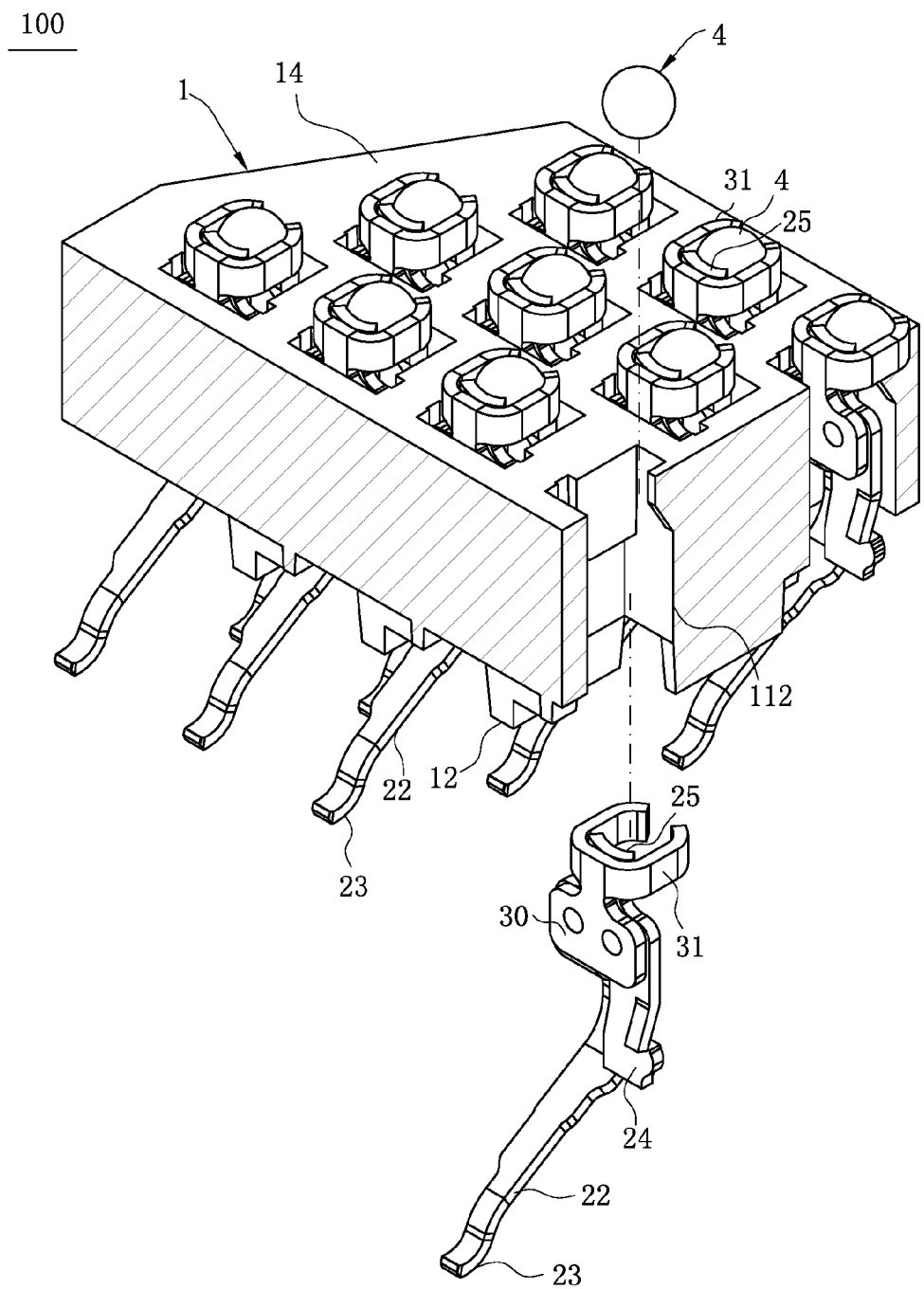
FIG. 11 is another plan view of FIG. 10.

As shown in FIG. 9 to FIG. 11, an electrical connector 100 in embodiment 2 according to the present invention differs from that in embodiment 1 in that:

1. The bottom surface of the second side wall 112 of the insulating body 1 is not upwardly and concavely provided with a groove 1121 to limit the solder ball 4 from moving up, but the second side wall 112 which is convexly provided with a protruding portion 1122 toward the vertical plane 203 of the base portion 20 is positioned above the solder ball 4 to limit the solder ball 4 from moving up.

2. The fixing mode of the metal member 3 and the terminal 2 in embodiment 2 differs from that in embodiment 1; in embodiment 2, the connecting portion 30 and the vertical plane 203 of the base portion 20 are soldered by laser so that the metal member 3 and the terminal 2 are fixed.

As shown in FIG. 12 to FIG. 15, an electrical connector 100 for electrically connecting a chip module 200 to a circuit board 300 in embodiment 3 according to the present invention comprises an insulating body 1, provided with multiple receiving holes 11 running through the insulating body 1 vertically; multiple terminals 2, respectively and correspondingly received in the receiving holes 11; and multiple metal members 3, where each of the metal members 3 and the terminal 2 are fixed and received in the same receiving hole 11, and each of the metal members 3 and the terminal 2 jointly clamp and fix a solder ball 4.

As shown in FIG. 12 to FIG. 15, the insulating body 1 is provided with an upper surface 13 and a lower surface 14 which are oppositely arranged, and the upper surface 13 is upwardly and convexly provided with multiple protruding blocks 12 for supporting the chip module 200. Each of the receiving holes 11 is provided with two opposite first side walls 111, the two first side walls 111 are oppositely and concavely provided with two retaining slots 110, and the receiving hole 11 is also provided with a second side wall 112 connected with the two first side walls 111.

As shown in FIG. 12 to FIG. 15, each of the terminals 2 is provided with a base portion 20 which is in a flat plate shape and is retained in the retaining slot 110, wherein the base portion 20 is provided with a first side surface 201 and a second side surface 202 which are oppositely arranged, and the first side surface 201 faces the second side wall 112. A first arm 21 is formed by bending and extending upwardly from the base portion 20 to a direction away from the first side surface 201, and a second arm 22 is formed by inversely bending and extending from the first arm 21 to pass beyond the first side surface 201; and an arc-shaped contact portion 23 is formed by extending from the tail end of the second arm 22 and abuts up the chip module 200. A strip connecting portion 24 which is formed by upwardly extending from the other side of the base portion 20 is used for connecting a strip (not shown), and a gap 240 is reserved between the strip connecting portion 24 and the first arm 21. A bending portion 26 is formed by downwardly bending from the base portion 20 followed by horizontally extending, and downwardly bending after the horizontally extending, and a soldering portion 25 which is in a flat plate shape is formed by vertically and downwardly extending from the bending portion 26. That is, the bending portion 26 is formed by extending from the upper end of the soldering portion 25, and includes a first upward bending portion 261 formed by upwardly extending and bending from the upper end of the soldering portion 25, a horizontal extending portion 262 formed by extending horizontally from the first upward bending portion 261, and a second upward bending portion 263 formed by upwardly extending and bending from the horizontal extending portion 262. Further, the bending portion 26 and the first arm 21 are positioned at the same side of the first side surface 201; and the bending portion 26 is positioned above the solder ball 4 to stop the solder ball 4 from moving up. A holding arm 251 is formed by bending and extending from one side of the soldering portion 25 along the horizontal direction; and the holding arm 251 extends from the second side surface 202 toward the second side wall 112 and is stopped below the second side wall 112 to limit the terminal 2 from moving up.

Figure 12:
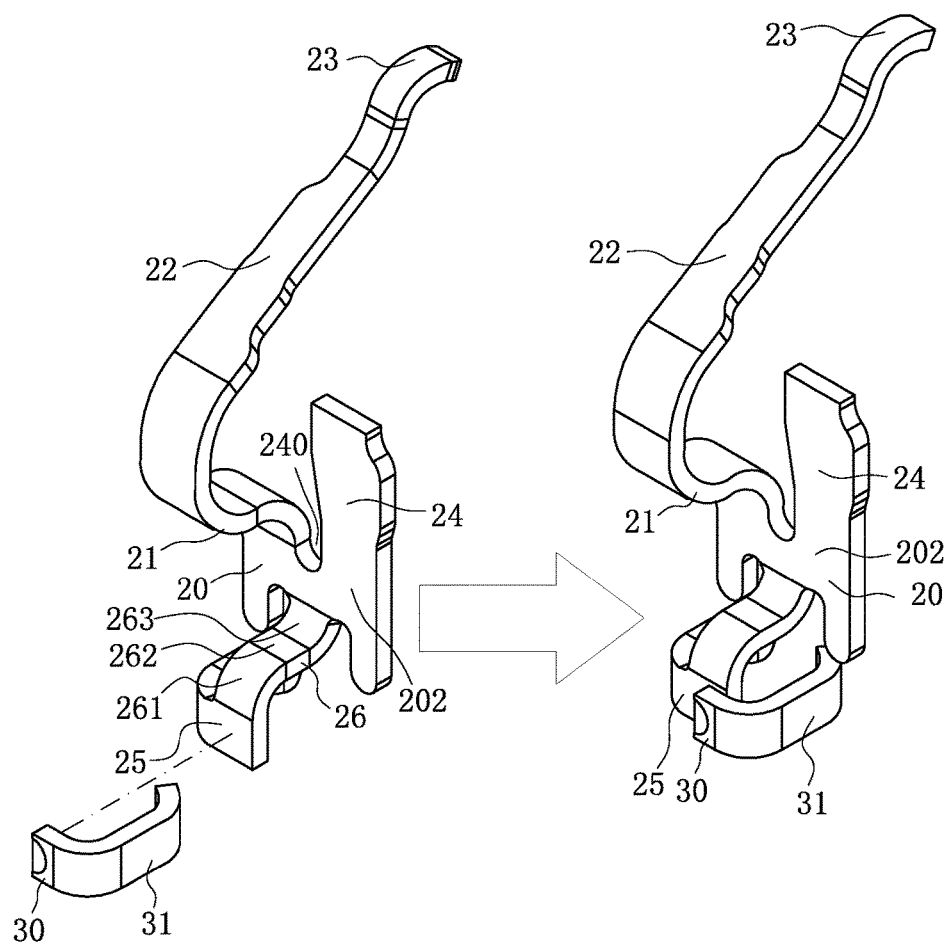
FIG. 12 is a schematic diagram of laser soldering of terminals and metal members of embodiment 3 of the electrical connector according to the present invention.
Figure 13:
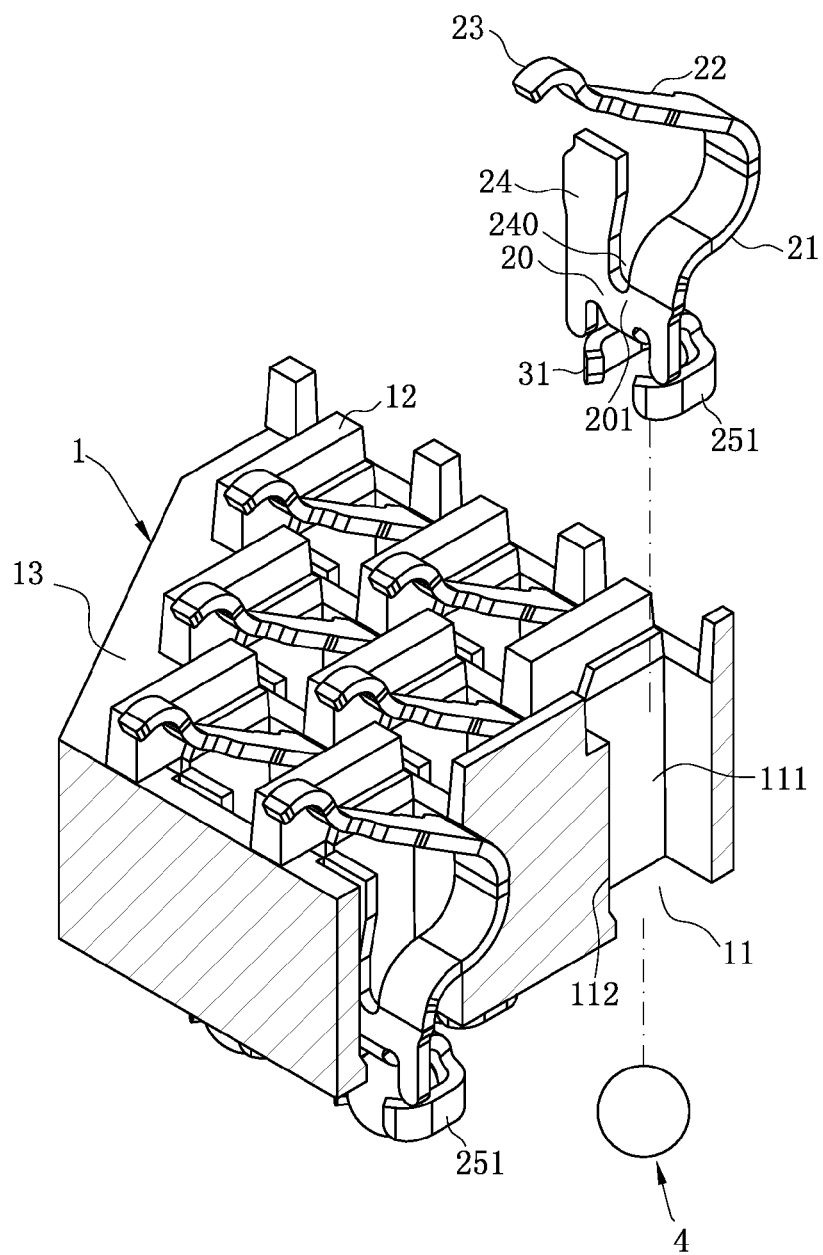
FIG. 13 is a three-dimensional sectional view of embodiment 3 of the electrical connector according to the present invention.
Figure 14:
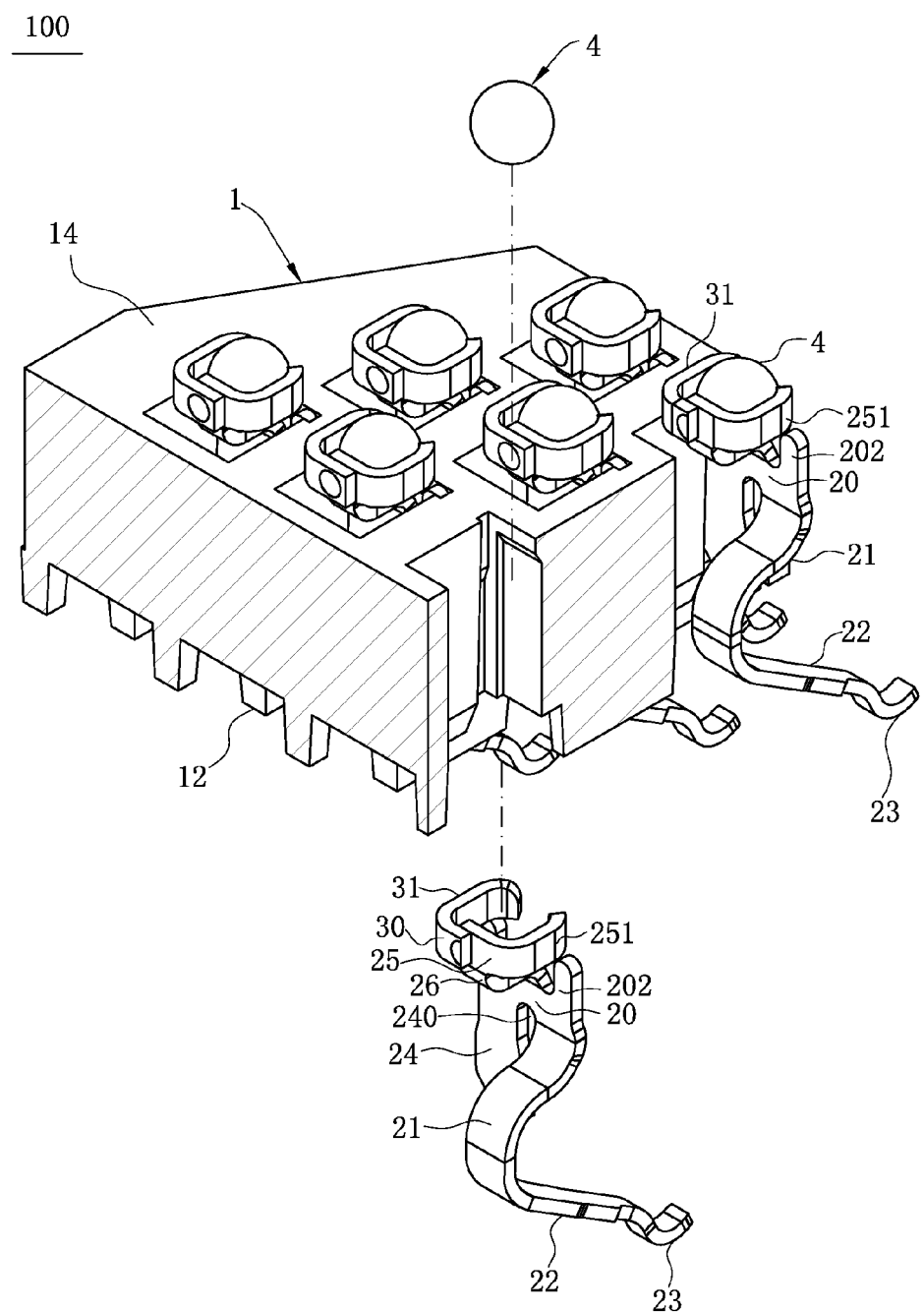
FIG. 14 is another plan view of FIG. 13.
Figure 15:
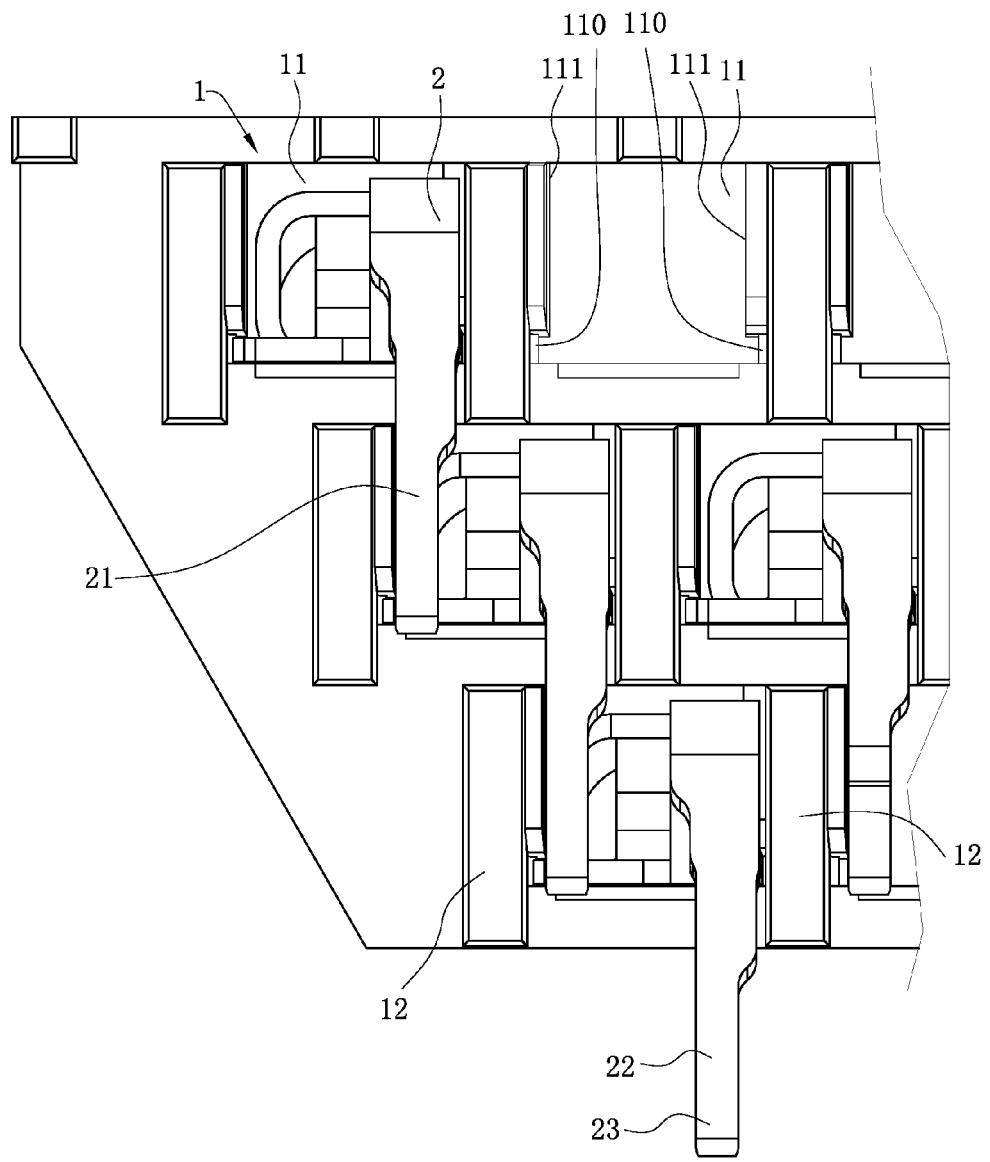
FIG. 15 is a planar sectional view of FIG. 13.

As shown in FIG. 12, the metal member 3 is not in contact with the chip module 200, and comprises a connecting portion 30 which is in a vertical flat plate shape, where the connecting portion 30 is positioned at one side of the soldering portion 25, and the connecting portion 30 and the soldering portion 25 are soldered by laser. A clamping portion 31 is formed by horizontally bending and extending from one side of the connecting portion 30, and the clamping portion 31 bypasses the soldering portion 25 and extends to the other opposite side of the soldering portion 25; and the clamping portion 31 and the soldering portion 25 are respectively positioned at the two opposite sides of the solder ball 4, and the clamping portion 31, the soldering portion 25 and the holding arm 251 jointly clamp the solder ball 4. The clamping portion 31 extends from the second side surface 202 toward the second side wall 112 and is stopped below the second side wall 112 to limit the clamping portion 31 from moving up.

To sum up, the electrical connector 100 of the present invention has the following beneficial effects:

(1) The solder ball 4 is fixed and jointly clamped by the metal member 3 and the terminal 2, so that the distance between the terminals 2 on a strip is greatly reduced, and the assembly procedure that the terminals 2 are inserted into the same row of receiving holes 11 can be completed once without inserting the terminals 2 into the same row of receiving holes 11 at intervals for multiple times.

(2) The soldering portion 25 is positioned at one side of the solder ball 4 and is in an arc shape along the horizontal direction, thereby increasing the contact area between the soldering portion 25 and the solder ball 4, and ensuring that the solder ball 4 is stably retained by the terminal 2.

(3) The connecting portion 30 and the base portion 20 are soldered by laser, and the soldering area is large, thereby ensuring that the metal member 3 and the terminal 2 are stably combined.

(4) Both the connecting portion 30 and the soldering portion 25 extend out of the lower surface 14 of the insulating body 1, thereby being favorable for laser soldering of the connecting portion 30 and the soldering portion 25 after the terminal 2 and the metal member 3 are inserted into the insulating body 1.

(5) Both the clamping portion 31 and the first arm 21 are positioned at one side of the first side surface 201, thereby reducing the width of the receiving hole 11, and being favorable for realizing a higher density of the terminals 2 on the insulating body 1.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, comprising:
　an insulating body, provided with a plurality of receiving holes running through the insulating body vertically;
　a plurality of terminals, respectively and correspondingly received in the receiving holes, wherein each of the terminals has a soldering portion; and
　a plurality of metal members, not in contact with the chip module and fixed on the terminals, wherein each of the metal members and a corresponding terminal are received in the same receiving hole, and each of the metal members having:
　　a connecting portion, disposed at a first side of the soldering portion; and
　　a clamping portion, formed by extending and bending from the connecting portion to bypass the soldering portion and extend toward a second side of the soldering portion opposite to the first side, so that the clamping portion and the soldering portion jointly clamp a solder ball.

2. The electrical connector according to claim 1, wherein each of the metal members has two clamping portions formed by extending and bending from two opposite sides of the connecting portion along a horizontal direction, respectively.

3. The electrical connector according to claim 2, wherein each of the receiving holes has two first side walls opposite to each other, a retaining slot for retaining one of the terminals is concavely formed on each of the first side walls, and the two clamping portions extend out of a lower surface of the insulating body and are stopped below a bottom surface of the first side walls.

4. The electrical connector according to claim 1, wherein each of the terminals has
　a base portion in a vertical flat plate shape;
　a first arm, formed by extending and bending upwardly from the base portion along a direction away from a vertical plane where the base portion is positioned; and
　a second arm, formed by extending and bending from the first arm inversely to pass beyond the vertical plane where the base portion is positioned,
　wherein a contact portion is formed by extending from a tail end of the second arm and is used for abutting up the chip module, and the first arm and the clamping portion are positioned at the same side of the vertical plane where the base portion is positioned.

5. The electrical connector according to claim 4, wherein a strip connecting portion in a flat plate shape and formed by upwardly and vertically extending from the base portion is used for connecting a strip, and a gap is reserved between the strip connecting portion and the first arm;

wherein a stopping portion is formed from the connecting portion, and the stopping portion downwardly and obliquely extends to the base portion; and wherein the gap is provided with a bottom surface positioned below the stopping portion to limit the metal member from moving down.

6. The electrical connector according to claim 5, wherein a limiting portion is formed from a side of the strip connecting portion away from the first arm, and the limiting portion upwardly and obliquely extends to the connecting portion; and wherein a notch is formed on one side of the connecting portion, and the notch is provided with a top surface positioned above the limiting portion to limit the metal member from moving down.

7. The electrical connector according to claim 4, wherein the connecting portion is in a vertical flat plate shape, and the connecting portion and the vertical plane where the base portion is positioned are soldered by laser.

8. The electrical connector according to claim 1, wherein both of the connecting portion and the soldering portion are in a vertical flat plate shape, the connecting portion and the soldering portion are soldered by laser, and the connecting portion and the soldering portion extend out of a lower surface of the insulating body.

9. The electrical connector according to claim 1, wherein the clamping portion is formed by bending and extending from one side of the connecting portion along a horizontal direction, a holding arm is formed by bending and extending from one side of the soldering portion along the horizontal direction, and the soldering portion, the holding arm and the clamping portion jointly clamp the solder ball.

10. The electrical connector according to claim 1, wherein the soldering portion and the clamping portion extend out of a lower surface of the insulating body, and the clamping portion is stopped at the lower surface of the insulating body.

11. The electrical connector according to claim 1, further comprising:

a bending portion extending from the soldering portion, comprising:

a first upward bending portion, extending and bending upwardly from an upper end of the soldering portion;

a horizontal extending portion, extending horizontally from the first upward bending portion; and a second upward bending portion, extending and bending upwardly from the horizontal extending portion; and a base portion extending upwardly and vertically from the bending portion, the base portion having a first side surface and a second side surface opposite to each other, wherein one of the receiving holes has a second side wall facing the first side surface, and the clamping portion extends from the second side surface toward the first side surface and is stopped below a bottom surface of the second side wall.

12. The electrical connector according to claim 4, wherein the soldering portion is positioned at one side of the solder ball and is in an arc shape along a horizontal direction.

\* \* \* \* \*